United States Patent [19]

Strack et al.

[11] Patent Number: 4,792,839
[45] Date of Patent: Dec. 20, 1988

[54] SEMICONDUCTOR POWER CIRCUIT BREAKER STRUCTURE OBVIATING SECONDARY BREAKDOWN

[75] Inventors: Helmut Strack; Helmut Herberg, both of Munich, Fed. Rep. of Germany

[73] Assignee: Siemens Aktiengesellschaft, Berlin and Munich, Fed. Rep. of Germany

[21] Appl. No.: 136,449

[22] Filed: Dec. 21, 1987

Related U.S. Application Data

[63] Continuation of Ser. No. 810,437, Dec. 17, 1985, abandoned.

[30] Foreign Application Priority Data

Dec. 27, 1984 [DE] Fed. Rep. of Germany ....... 3447513

[51] Int. Cl.⁴ .......................................... H01L 29/74
[52] U.S. Cl. ....................................... 357/38; 357/20; 357/36; 357/86
[58] Field of Search .................... 357/20, 36, 38, 86

[56] References Cited

U.S. PATENT DOCUMENTS

| | | | |
|---|---|---|---|
| 3,439,239 | 4/1969 | Herlet et al. | 357/38 |
| 3,487,276 | 12/1969 | Wolley | 357/38 |
| 3,513,363 | 5/1970 | Herlet | 357/38 |
| 3,524,115 | 8/1970 | Herlet | 357/38 |
| 3,619,738 | 11/1971 | Otsuka | 357/36 |
| 3,794,890 | 2/1974 | Weimann et al. | 357/38 |
| 3,896,477 | 7/1975 | Hutson | 357/38 |
| 4,079,406 | 3/1978 | Burtscher et al. | 357/38 |
| 4,581,626 | 4/1986 | Krishna et al. | 357/38 |
| 4,626,886 | 12/1986 | Tihanyi | 357/36 |

FOREIGN PATENT DOCUMENTS

| | | |
|---|---|---|
| 0110777 | 6/1984 | European Pat. Off. |
| 2424631 | 11/1979 | France |
| 2077491 | 12/1981 | United Kingdom |

OTHER PUBLICATIONS

J. Shimizu et al., "H–V, H–P, 6–A–Fo Thyris for H–F Use", IEEE Trans. on Elec. Dev., vol. ED23#8, Aug. 1976, pp. 883–887.

Motorola Semiconductor Data Book ©1966 Motorola, Inc., 2nd Edition, Aug. 1966, pp. 16–104.

Electronic Components and Applications, vol. 4, No. 1, Burgum et al., Entitled "Fast Turn–Off Asymmetric Silicon Controlled Rectifiers", pp. 2 to 10.

*Primary Examiner*—Joseph E. Clawson, Jr.
*Attorney, Agent, or Firm*—John Francis Moran

[57] ABSTRACT

A semiconductor power circuit breaker has several emitter zones of a width (b) less than 30 microns. The semiconductor device may be in the form of a switching transistor or a gate turn off (GTO) thyristor. The spacing (a) of the emitter zones is less than the thickness (d) of the low doped inner zone. The power circuit breaker can thus be operated up to the collector-base breakdown voltage $U_{CBO}$ without a destruction through "second break-down" occurring. On the other hand, high current carrying capacity is maintained, since it depends practically only on the chip surface instead of being a function of emitter area.

8 Claims, 2 Drawing Sheets

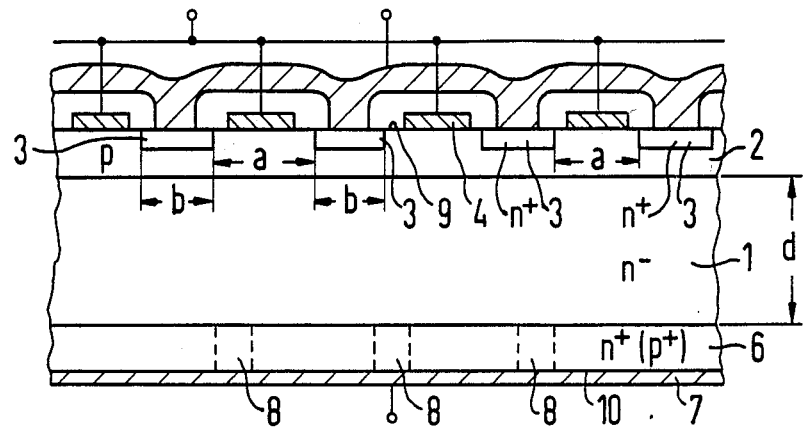
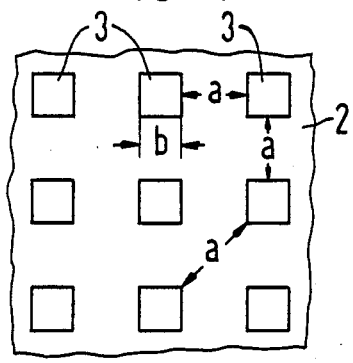
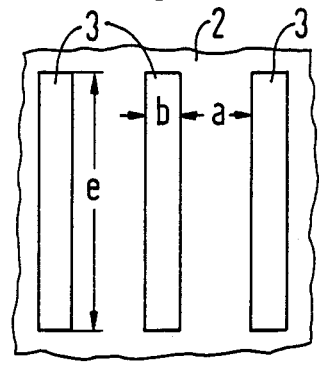
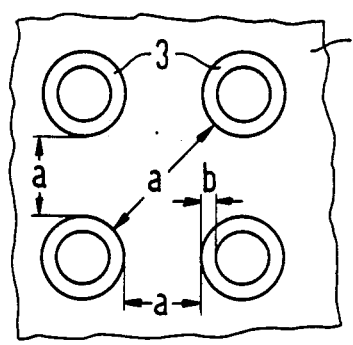
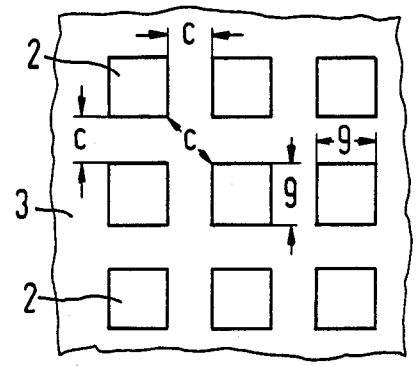

SEMICONDUCTOR POWER CIRCUIT BREAKER STRUCTURE OBVIATING SECONDARY BREAKDOWN

CROSS-REFERENCE TO RELATED APPLICATION

This is a continuation of Ser. No. 810,437 filed Dec. 17, 1985, now abandoned.

BACKGROUND OF THE INVENTION

This invention relates to a semiconductor power circuit breaker, and, more particularly, it relates to a device having a structure which prevents the occurrence of secondary breakdown at low threshold voltages.

The operation of a semiconductor power circuit breaker such as a switching transistor or a Gate Turn Off (GTO) thyristor is characterized by two operating states. In the current conducting state or on state, a residual voltage generally corresponding to the saturation voltage and being on the order of magnitude of one volt or less is applied to the power circuit breaker. In the off state or blocking state, the entire operating voltage is applied to the semiconductor power circuit breaker. When switching from the on state to the off state and vice versa, the power circuit breaker passes through areas in the family of characteristics called "safe operating areas" (SOA). These areas indicate the current/voltage values which the power circuit breaker must not exceed as a function of the operating temperature as a parameter. These safe operating areas are defined for both the conducting state and non-conducting state. The safe operating area for the non-conducting state is the more important one because the non-conducting state is the more critical one. One reason is that the off behavior of the semiconductor substantially determines the capacity of the equipment in which the device is installed or may be associated in operation.

The safe operating area or region of a semiconductor power circuit breaker for the cutoff process, i.e. when the emitter-base-pn junction is biased in the blocking or reverse direction, called RBSOA (Reverse Bias SOA) is shown diagrammatically in FIG. 1. It is designated as region A for a conventional semiconductor power circuit breaker in dc operation and may be extended into region B for pulse operation. For both cases, the maximum operating voltage is $U_{CEO}$, i.e. the maximum emitter-collector voltage with open base terminal. This voltage must not be exceeded if the breaker is not to fail because of "secondary breakdown".

FIG. 2 illustrates this process. Therein is shown a semiconductor power circuit breaker with a semiconductor body. It has a first zone 1 which is n-doped, for example. Abutting zone 1 is a second zone 2 of the opposite conduction type with higher doping than zone 1. Abutting the second zone 2 is a third zone 3 of the first conduction type with higher doping than the second zone 2. The side of the first zone 1 facing away from the second zone 2 is abutted by a fourth zone 6 which is n-doped for a switching transistor and higher doped than zone 1. For a GTO thyristor, this zone is p-doped and has a higher doping concentration than zone 1.

It should also be pointed out that power transistors of this general configuration are also known to include multiple emitter regions such as disclosed in a commonly assigned application now matured into U.S. Pat. No. 4,626,886.

In the breaker's cut-in-state, the emitter electrode 5 is subjected to a negative potential, the anode electrode 7 zero potential, and the gate electrode is maintained at a positive potential. Zone 1 is then flooded with charge carriers and the breaker is conducting. For blocking, the gate electrode 4 is reverse biased with respect to the emitter electrode 5. Then the charge carriers stored mainly in zone 1 drain toward electrodes 4 and 7, respectively. In FIG. 1, the path of the positive charge carriers to the electrode 4 is marked by arrows 1. These carriers follow the path produced by the direction of the field intensity in the direction to the emitter zone 3 and then drain radially outward to the electrodes 4. This generates an emitter bias which is highest in the center of the emitter 3. If it exceeds approximately 0.7 volts in the center of the emitter 3, the emitter will start to emit carriers at this point. Once stared, this process can yet spread and grow by carrier multiplication until the breaker is destroyed by local overheating. This phenomemon is called secondary breakdown. Therefore, a conventional switching transistor may be operated below the voltage at which carrier multiplication does not yet occur. This voltage is the voltage $U_{CEO}$ shown in FIG. 1.

SUMMARY OF THE INVENTION

An illustrative embodiment of the invention takes the form of semiconductor power circuit breaker with a semiconductor body having these features:

(a) The semiconductor body has a first zone of the first conductivity type and a given doping level, (b) abutting the first zone and the first surface of the semiconductor body is a second zone of the second conductivity type and a higher doping level than the first zone, (c) abutting the second zone and the first surface of the semiconductor body is at least one emitter zone of the first conductivity type and a higher doping level than the second zone, (d) abutting the first zone and the second surface of the semiconductor body is a fourth zone doped higher than the first zone.

Such features are present in conventional semiconductor power circuit breakers.

It is an object of the invention to provide a semiconductor power circuit breaker of the foregoing kind so that it can be operated with a voltage higher than the voltage $U_{CEO}$.

The solution according to the invention takes the form of a semiconductor power circuit breaker including the additional features of:

(e) abutting the second zone and the first surface of the semiconductor body is a multiplicity of emitter zones, (f) the width (b) of the emitter zones is less than 30 microns, (g) the mutual spacing (a) of the emitter zones is less than the thickness (d) of the first zone, and (h) the emitter zone are mutually paralleled electrically.

According to an alternative illustrative embodiment of the invention the problem can also be solved by providing the following features:

(e) the emitter zone is of matrix design, (f) within the emitter zone, the second zone penetrates to the first surface of the semiconductor body in areas separated from each other, (g) the mutual spacing (c) between the areas is less than 30 microns, and (h) the lateral dimensions (g) of the areas are smaller than the thickness (d) of the first zone.

BRIEF DESCRIPTION OF THE DRAWING

Additional features of the invention and additional objects of the invention will be more readily appreciated and better understood by reference to the following detailed description which should be considered in conjunction with the drawing.

Figure 1:
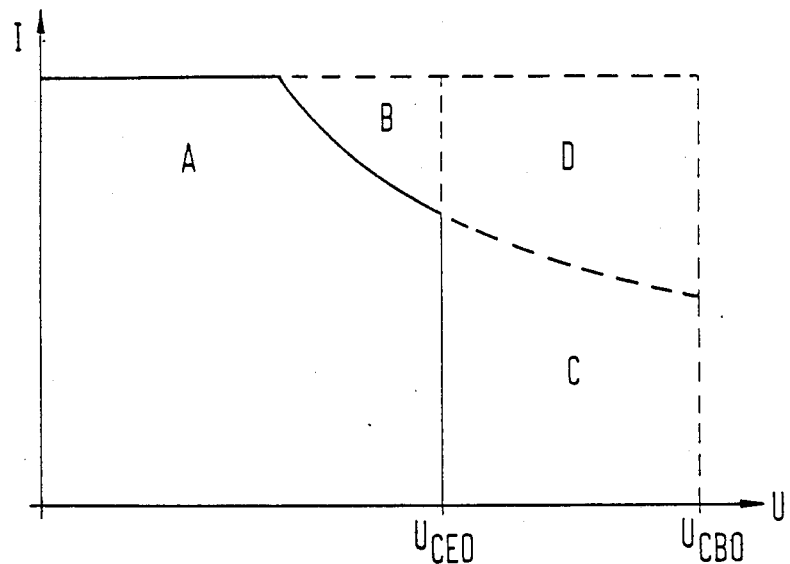
FIG. 1 depicts the operating regions in the blocking direction of a semiconductor power circuit breaker.
Figure 2:
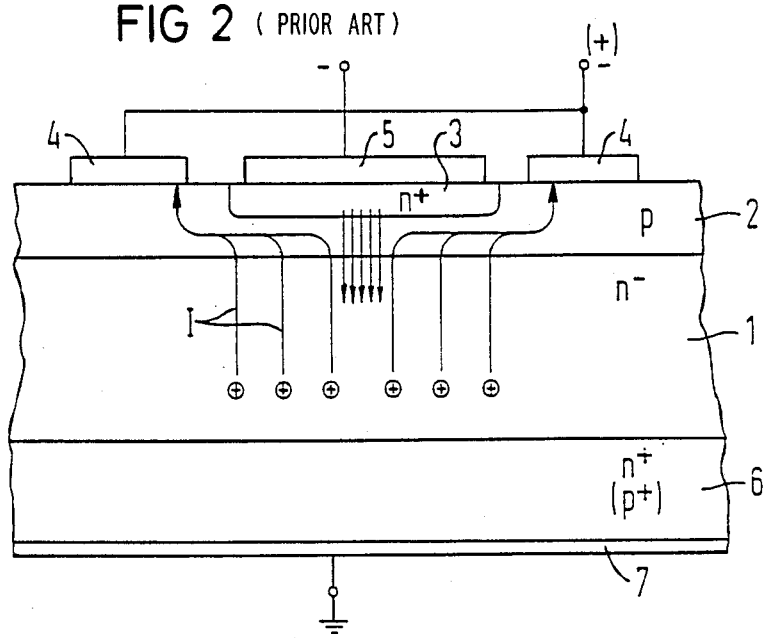
FIG. 2 illustrates the carrier distribution of a typical conventional semiconductor power circuit breaker which may result in secondary breakdown.

The invention is explained in greater detail by way of a plurality of illustrative embodiments in connection with FIGS. 3 to 7, wherein:

FIG. 3 is a sectional view of a semiconductor power circuit breaker with its characteristic physical dimensions, FIG. 4 is a top view of a semiconductor power circuit breaker with several small area emitter zones, FIG. 5 depicts a top view of a second illustrative embodiment including several emitter zones in the form of strips, FIG. 6 is a top view of another illustrative embodiment containing several ringshaped emitter zones, and FIG. 7 illustrates a top view of another embodiment example in which the emitter is designed as a matrix of areas forming a mesh type of structure.

DETAILED DESCRIPTION

In FIG. 3, the illustrative semiconductor power circuit breaker is shown in cross-sectional representation and may be either a switching transistor or a GTO thyristor. In the case of a switching transistor, the sequence of zones from top to bottom is $n^+pn^-n^+$ while in the case of the GTO thyristor the sequence of zones is $n^+pn^-p^+$. Zone 2 is disposed between zone 1 and surface 9 of the semiconductor body. As shown in FIG. 4, the plurality of emitter zones 3 may be formed of a plurality of electrically paralleled emitter areas 3, each forming a self-contained area. These emitter cells, for example, may be square, rectangular, round or polygonal. They border the second zone 2 on the one hand and the first surface 9 of the semiconductor body on the other. The mutual spacing between the regions of the emitter cells is designated a, their width b, while the thickness of the first zone 1 is designated as d. It is essential that the width b of the emitter cells 3 be less than 30 microns and that the greatest mutual spacing a between the emitter zones be less than the thickness d of the first zone 1. The spacing a of the emitter cells 3 must satisfy this condition in every direction on the surface of the semiconductor body, i.e. in both the x and y directions as well as diagonally, as shown in FIG. 4.

Since the width of the emitter cells 3 is the only dimension which is critical, lengthwise the emitter cells 3 may be designed in strip form. For example, emitter cells 3 may have a length a much greater than the width b. The mutual spacing of the emitter cells may be measured in a number of ways when the emitters are ringshaped, as shown in FIG. 6. The spacing of the emitter cells 3 is likewise designated a and is subject to the above mentioned conditions that it must be less than the thickness d of the first zone 1. The width b is here the width of the ring, and not perhaps the outside diameter of the entire cell. The interior of the ring in which the base zone penetrates to the semiconductor body surface 9 may be contacted.

In FIG. 7, a breaker is shown with a mesh structure for the emitter 3. Provided here is only one single coherent emitter zone, within which the base zone 2 penetrates to the semiconductor body surface 9 in individual areas. FIG. 7 represents an alternative illustrative embodiment to those discussed in connection with FIGS. 4, 5 and 6. In FIG. 7, the width of the emitter zone is determined here by the spacing c of the base zone areas. The greatest spacing c is likewise less than 30 microns while the lateral dimensions g of the base zone areas are smaller than the thickness d of the first zone 1. They are preferably between 0.1 and 0.7 times the thickness d.

A range from 1 to 10 microns is preferred as width b and c, respectively. The emitters should be made as narrow as possible. The lower width limit is determined by the way the semiconductor body is produced on the one hand and also by the manner the emitter zones are contacted. The total emitter surface should not fall below a certain value so as not to exceed the critical emitter current density of $10^4$ to $10^5$ A/cm$^2$. The lower limit for the spacing a and g, respectively, is determined by the way the base zone is contacted. The upper limit for the spacing a=d should not be exceeded, or else the utilization of the semiconductor body surface would be worsened and the current capacity lessened.

Tests with breakers having an emitter zone width of 2, 5, 10, 20 microns, a spacing a=40 microns, a thickness d=100 microns and a doping of the first zone 1 of $10^{14}$ atoms/cm$^3$ have shown that, in the dc case, such a breaker can be loaded up to the area marked C in FIG. 1 and, in the pulse case, even up to the E area. This becomes understandable because the narrow width of the emitter zone 3 together with the rest of the breaker parameters cannot produce a voltage under the emitter zones greater than 0.7 V, even in the short-circuit case. Accordingly, the switching transistor works practically as a diode with the zones 2, 1 and 6 in the cut-out process.

Therefore, it is possible employing the inventive principles to load a semiconductor power circuit breaker with an operating voltage higher than $U_{CEO}$. Despite a drastic reduction of the emitter area in relation to conventional practices according to the state of the art, no current carrying capacity reduction was observed. The explanation for this is that, starting from the emitter side to the cathode side, the current-carrying areas in zone 1 widen at an angle of about 45°. But contrary to the opinion held heretofore, the semiconductor body surface, and not the emitter surface, is almost exclusively the governing physical characteristic for determining the current carrying capacity.

To obtain the same result in a GTO thyristor, zone 6, located between zone 1 and the second surface 10 of the semiconductor, is provided in the usual manner with shunts 8 through which the first zone 1 penetrates to the electrode 7. This short-circuits zone 6 in certain areas to zone 1, making it ineffective in the cut-out case.

There has thus been shown and described a novel power semiconductor device which fulfills all the objects and advantages sought therefor. Many changes, modifications, variations and other uses and applictions of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

We claim:

1. A switching transistor having a semiconductor body including a first surface and a second surface comprising:
   (a) a first zone of a first conductivity type having a predetermined doping concentration level and a thickness between the first surface and the second surface;
   (b) a second zone of a second conductivity type abutting the first zone and the first surface of the semiconductor body, the second zone having a higher doping concentration level than the first zone;
   (c) a plurality of electrically paralleled emitter zones embedded into the second zone at the first surface of the semiconductor body, the emitter zones each being of the first conductivity type and having a higher doping concentration level than the second zone;
   (d) each of the emitter zones having a width that is less than 30 microns and each proximate pair of emitter zones having a spacing distance between them;
   (e) the spacing distance being less than the thickness of the first zone; and
   (f) a fourth zone of the first conductivity type doped to higher concentration level than the first zone, abutting the first zone and located on the second surface of the semiconductor body.

2. A switching transistor having a semiconductor body including a first surface and a second surface comprising:
   (a) a first zone of a first conductivity type having a predetermined doping level;
   (b) a second zone of a second conductivity type abutting the first zone and the first surface of the semiconductor body and having a higher doping concentration level than the first zone;
   (c) a single coherent emitter zone of the first conductivity type and a doping concentration level higher than that of the second zone abutting the second zone at the first surface of the semiconductor body;
   (d) a fourth zone of the first conductivity type and a doping concentration level higher than the first zone, abutting the first zone at the second surface of the semiconductor body;
   (e) the second zone extends to the first surface of the semiconductor body within individual areas separated from each other;
   (f) the greatest spacing (c) between the areas being less than 30 microns; and
   (g) the lateral dimensions (f) of the areas of the second zone are less than the thickness (d) of the first zone.

3. The switching transistor according to claim 1, characterized in that the emitter zones are designed as ringshaped.

4. The switching transistor according to claim 1, characterized in that the emitter zones are designed as ringshaped.

5. A switching transistor according to claim 1, characterized in that the emitter zones have lateral dimensions are between 0.1 and 0.7 times the thickness (d) of the first zone.

6. A switching transistor according to claim 1, characterized in that the spacing distance between emitter areas is between 1 and 10 microns.

7. A switching transistor according to claim 5, characterized in that the spacing distance between emitter areas is between 1 and 10 microns.

8. A switching transistor according to claim 1, characterized in that the total area of the emitter zones is at least a predetermined area so that a current density of $10^4$ to $10^5$ A/cm$^2$ is not exceeded.

* * * * *